(12) United States Patent
Mugler, III et al.

(10) Patent No.: US 11,860,258 B2
(45) Date of Patent: Jan. 2, 2024

(54) METHODS AND SYSTEMS FOR MAXWELL COMPENSATION FOR SPIN-ECHO TRAIN IMAGING

(71) Applicants: University of Virginia Patent Foundation, Charlottesville, VA (US); THE UNITED STATES OF AMERICA, AS REPRESENTED BY THE SECRETARY DEPARTMENT OF HEALTH AND HUMAN SERVICES, Bethesda, MD (US); Siemens Healthcare GMBH, Erlangen (DE)

(72) Inventors: John P. Mugler, III, Charlottesville, VA (US); Craig H. Meyer, Charlottesville, VA (US); Adrienne Campbell, Washington, DC (US); Rajiv Ramasawmy, Bethesda, MD (US); Josef Pfeuffer, Erlangen (DE); Zhixing Wang, Charlottesville, VA (US); Xue Feng, Zion Crossroads, VA (US)

(73) Assignees: UNIVERSITY OF VIRGINIA PATENT FOUNDATION, Charlottesville, VA (US); SIEMENS HEALTHCARE GMBH, Erlangen (DE); THE UNITED STATES OF AMERICA, AS REPRESENTED BY THE SECRETARY, DEPARTMENT OF HEALTH AND HUMAN SERVICES, Bethesda, MD (US)

( * ) Notice: Subject to any disclaimer, the term of this patent is extended or adjusted under 35 U.S.C. 154(b) by 0 days.

(21) Appl. No.: 17/732,155

(22) Filed: Apr. 28, 2022

(65) Prior Publication Data
US 2022/0357416 A1 Nov. 10, 2022

Related U.S. Application Data

(60) Provisional application No. 63/180,807, filed on Apr. 28, 2021, provisional application No. 63/318,156, filed on Mar. 9, 2022.

(51) Int. Cl.
*G01R 33/565* (2006.01)
*G01R 33/561* (2006.01)

(52) U.S. Cl.
CPC ... *G01R 33/56581* (2013.01); *G01R 33/5618* (2013.01)

(58) Field of Classification Search
CPC ............ G01R 33/4824; G01R 33/5617; G01R 33/5618; G01R 33/56581
See application file for complete search history.

(56) References Cited

U.S. PATENT DOCUMENTS 5,229,717 A * 7/1993 Hinks ................ G01R 33/5615
324/309
5,280,244 A * 1/1994 Hinks ............... G01R 33/56509
324/309

(Continued)

*Primary Examiner* — Steven L Yeninas
(74) *Attorney, Agent, or Firm* — Troutman Pepper Hamilton Sanders LLP

(57) ABSTRACT

Methods, computing devices, and MRI systems that reduce artifacts produced by Maxwell gradient terms in TSE imaging using non-rectilinear trajectories are disclosed. With this technology, a RF excitation pulse is generated to produce transverse magnetization that generates a NMR signal and a series of RF refocusing pulses to produce a corresponding series of NMR spin-echo signals. An original encoding gradient waveform comprising a non-rectilinear trajectory is modified by adjusting a portion of the original encoding gradient waveform or introducing a zero zeroth-moment waveform segment at end(s) of the original encoding gradient waveform. During an interval adjacent to each of the series of RF refocusing pulses a first gradient pulse is (Continued)

generated. At least one of the first gradient pulses is generated according to the modified gradient waveform. An image is constructed from generated digitized samples of the NMR spin-echo signals obtained.

16 Claims, 10 Drawing Sheets
(4 of 10 Drawing Sheet(s) Filed in Color)

(56) References Cited

U.S. PATENT DOCUMENTS

| | | | | |
|---|---|---|---|---|
| 6,011,392 | A * | 1/2000 | Zhou | G01R 33/56581 |
| | | | | 324/309 |
| 6,043,656 | A * | 3/2000 | Ma | G01R 33/56518 |
| | | | | 324/309 |
| 11,294,016 | B1 * | 4/2022 | Foo | G01R 33/56554 |
| 2020/0309886 | A1 * | 10/2020 | von Deuster | G01R 33/5617 |
| 2021/0165061 | A1 * | 6/2021 | Koerzdoerfer | G06T 7/0012 |
| 2022/0099780 | A1 * | 3/2022 | Kettinger | G01R 33/56554 |
| 2022/0229136 | A1 * | 7/2022 | Kannengiesser | G01R 33/50 |

* cited by examiner

METHODS AND SYSTEMS FOR MAXWELL COMPENSATION FOR SPIN-ECHO TRAIN IMAGING

This application claims the benefit of U.S. Provisional Patent Application Ser. No. 63/180,807, filed on Apr. 28, 2021, and U.S. Provisional Patent Application Ser. No. 63/318,156, filed on Mar. 9, 2022, each of which is hereby incorporated by reference in its entirety.

This invention was made with government support under EB028773 awarded by the National Institutes of Health. The government has certain rights in the invention.

FIELD

This technology generally relates to magnetic resonance imaging (MRI) and, more particularly, to methods for correction of image artifacts caused by Maxwell (concomitant) terms produced by imaging gradients in MRI systems.

BACKGROUND

When a substance such as human tissue is subjected to a uniform static magnetic field (e.g., polarizing field $B_0$), the individual magnetic moments of the spins in the tissue attempt to align with this polarizing field and process about it at their characteristic Larmor frequency. If the substance is subjected to a time-varying magnetic field (e.g., excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation field $B_1$ is terminated, this signal may be received and processed to form an image.

When utilizing these signals to produce images, magnetic field gradients (e.g., $g_x$, $g_y$, and $g_z$) are employed for spatial encoding. Typically, the region to be imaged is scanned by a sequence of measurement cycles in which these gradients vary according to the particular localization method being used. The resulting set of received signals are digitized and processed to reconstruct the image using a reconstruction technique.

One method for producing images efficiently is known as turbo spin-echo (TSE) imaging, which is also referred to as Rapid Acquisition with Relaxation Enhancement (RARE) or fast spin-echo (FSE) imaging. TSE imaging typically utilizes a Carr-Purcell-Meiboom-Gill (CPMG) radio frequency (RF) pulse train to produce multiple spin-echo signals from a single RF excitation in which, for Cartesian encoding, each acquired echo signal is individually phase encoded. Each echo train, or "shot," therefore results in the acquisition of a plurality of lines of data (sometimes called views), which can yield sufficient data for image reconstruction from a single shot, although in most clinical applications a plurality of shots are used to acquire a complete data set.

Non-rectilinear encoding gradient waveforms, such as spiral-based gradient waveforms, in TSE imaging techniques have shown advantages over conventional Cartesian TSE imaging at high field strengths (e.g., 3 T), in terms of signal-to-noise ratio (SNR) efficiency, improved image contrast, and reduced specific absorption rate (SAR). Concomitant gradient effects may induce artifacts for TSE imaging, particularly at lower field strengths because the Maxwell field terms associated with those gradient effects scale inversely with field strength. In particular, the Maxwell term ($B_c$) is proportional to the gradient amplitudes and locations, and is inversely proportional to the main magnetic field strength ($B_0$), thus becoming larger at lower magnetic field strengths (e.g., 0.55 T):

$$B_c = \left(\frac{g_z^2}{8B_0}\right)(x^2+y^2) + \left(\frac{g_x^2+g_y^2}{2B_0}\right)z^2 - \left(\frac{g_x g_z}{2B_0}\right)xz - \left(\frac{g_y g_z}{2B_0}\right)yz$$

Maxwell effects for Cartesian TSE are primarily addressed by modifying or adding gradient waveforms applied between the excitation RF pulse and first refocusing RF pulse of each spin-echo train. If necessary, the phase-encoding gradients applied within echo spacings (between refocusing RF pulses) may also be derated. Nonetheless, these strategies to address Maxwell effects may be insufficient to adequately mitigate those effects in TSE imaging using non-rectilinear encoding gradient waveforms.

Unlike a conventional readout gradient waveform as used in Cartesian TSE, which is constant among echo spacings, non-rectilinear encoding gradient waveforms for TSE imaging, such as spiral readouts, may change among echo spacings along a given spin-echo train. These changes may be large enough to result in Maxwell field induced phase errors along the spin-echo train that substantially disturb the TSE signal pathways and disrupt the CPMG condition. Additionally, phase accruals induced by Maxwell terms may cause time and spatial dependent phase differences during the readout window. These effects may cause bands of signal loss and ghost artifacts that cannot be recovered in image reconstruction. Thus, Maxwell terms can be problematic for TSE imaging when the encoding waveforms vary along the spin-echo train, leading to severe signal dropouts, image blurring, and other undesirable artifacts, which are exaggerated when using prolonged, high-gradient amplitude waveforms at lower magnetic field strengths.

SUMMARY

In one aspect, a method for turbo spin-echo (TSE) imaging of a subject is disclosed that is implemented by one or more computing devices. The method includes generating a radio frequency (RF) excitation pulse to produce transverse magnetization that generates a nuclear magnetic resonance (NMR) signal and a series of RF refocusing pulses to produce a corresponding series of NMR spin-echo signals. An original encoding gradient waveform comprising a non-rectilinear encoding trajectory is modified by one or more of adjusting at least a portion of the original encoding gradient waveform or introducing at least one zero zeroth-moment waveform segment at one or both ends of the original encoding gradient waveform. During an interval adjacent to each of the series of RF refocusing pulses a first gradient pulse is generated. At least one of the first gradient pulses is generated according to the modified gradient waveform and the first gradient pulses encode the NMR spin-echo signals. An image is constructed from generated digitized samples of the NMR spin-echo signals obtained based on the encoding.

In another aspect, a computing device is disclosed that includes memory including programmed instructions stored thereon and one or more processors configured to execute the stored programmed instructions to facilitate TSE imaging of a subject. In particular, a RF excitation pulse is generated to produce transverse magnetization that generates a NMR signal and a series of RF refocusing pulses to produce a corresponding series of NMR spin-echo signals. An original encoding gradient waveform comprising a non-rectilinear encoding trajectory is modified by one or more of adjusting at least a portion of the original encoding gradient waveform or introducing at least one zero zeroth-moment waveform segment at one or both ends of the original encoding gradient waveform. During an interval adjacent to each of the series of RF refocusing pulses a first gradient pulse is generated. At least one of the first gradient pulses is generated according to the modified gradient waveform and the first gradient pulses encode the NMR spin-echo signals. An image is constructed from generated digitized samples of the NMR spin-echo signals obtained based on the encoding.

In yet another aspect, a magnetic resonance imaging (MRI) system is disclosed that includes a control sequencer coupled to a gradient subsystem that includes gradient amplifiers and gradient coils and an MRI subsystem that includes a static z-axis magnet and one or more RF coils. The MRI system includes a data acquisition and display (DADC) device that includes memory including programmed instructions stored thereon and one or more processors configured to execute the stored programmed instructions to facilitate TSE imaging of a subject. In particular, a RF excitation pulse is generated to produce transverse magnetization that generates a NMR signal and a series of RF refocusing pulses to produce a corresponding series of NMR spin-echo signals. An original encoding gradient waveform comprising a non-rectilinear encoding trajectory is modified by one or more of adjusting at least a portion of the original encoding gradient waveform or introducing at least one zero zeroth-moment waveform segment at one or both ends of the original encoding gradient waveform. During an interval adjacent to each of the series of RF refocusing pulses a first gradient pulse is generated. At least one of the first gradient pulses is generated according to the modified gradient waveform and the first gradient pulses encode the NMR spin-echo signals. An image is constructed from generated digitized samples of the NMR spin-echo signals obtained based on the encoding.

In some examples, the technology disclosed herein provides MRI or other imaging modalities that compensate for the concomitant (Maxwell) field or terms in two-dimensional (2D) interleaved-spiral TSE imaging and 2D spiral-ring TSE imaging at relatively low magnetic field strengths (e.g., 0.55 T and 1.5 T). With this technology, 2D interleaved-spiral and spiral-ring T2-weighted TSE pulse sequences are disclosed that incorporate gradient waveform modifications to reduce the negative impact of Maxwell terms and improve MRI image quality. An image reconstruction that mitigates the image degradation associated with Maxwell terms at the echo time and over echo spacings is also disclosed. The image reconstruction corrects for residual Maxwell and $B_0$-inhomogeneity induced phase accruals along the trajectory.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1A:
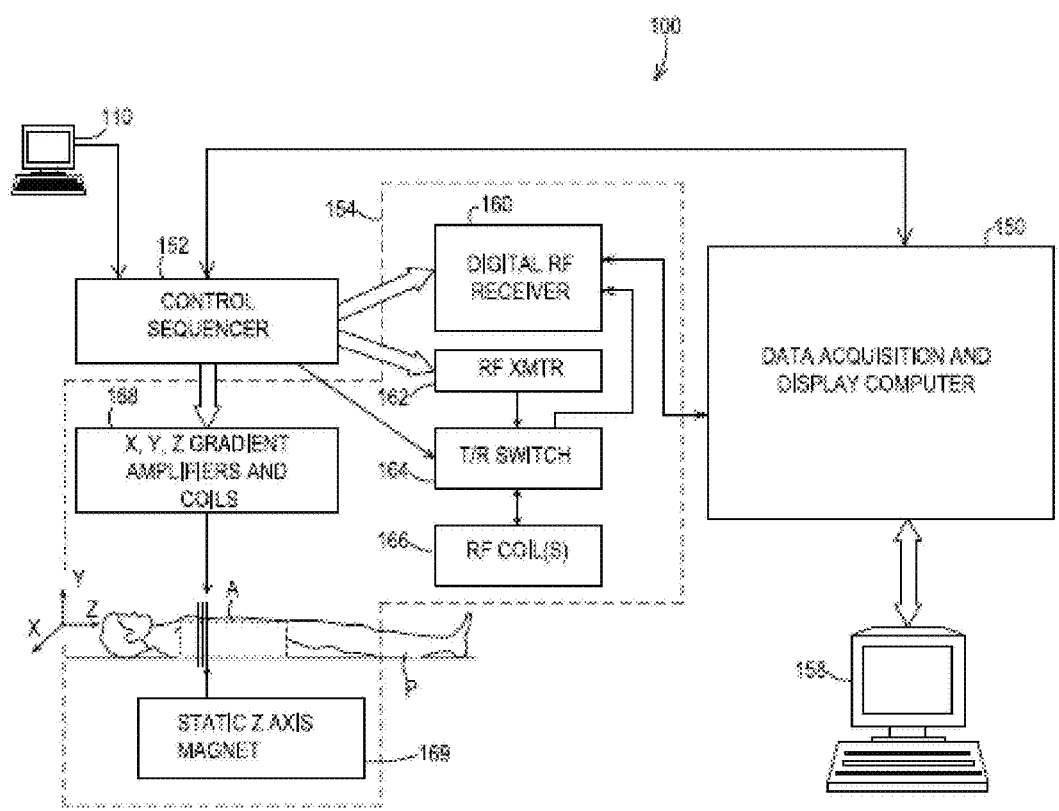
FIGS. 1A-B are block diagrams of exemplary magnetic resonance imaging (MRI) systems.

Referring to FIG. 1A, a block diagram of an exemplary magnetic resonance imaging (MRI) system 100 is illustrated. The MRI system 100 illustrates an exemplary operating environment capable of implementing aspects of the disclosed technology in accordance with one or more examples described and illustrated herein. The MRI system 100 in this example includes a data acquisition and display computer (DADC) 150 coupled to an operator console 110, an MRI real-time control sequencer 152, and an MRI subsystem 154. The MRI subsystem 154 may include a gradient subsystem 168 that includes X, Y, and Z magnetic gradient coils and associated amplifiers, a static Z-axis magnet 169, a digital radio frequency (RF) transmitter 162, a digital RF receiver 160, a transmit/receive switch 164, and RF coil(s) 166 (e.g., a whole-body RF coil).

The static Z-axis magnet 169 can provide a biasing magnetic field and the RF coil(s) 166 and subject P are positioned within the field of the Z-axis magnet 169. The RF coil(s) 166 can include a transmit coil, a receive coil, and/or a transceiver coil, for example. The RF coil(s) 166 are in communication with a processor (e.g., the control sequencer 152 and/or the processing unit 202 of the DADC 150). In various examples, the RF coil(s) 166 both transmit and receives RF signals relative to subject P. The MRI subsystem 154 can also include an analog-to-digital converter (ADC), a digital-to-analog converter (DAC), an amplifier, a filter, and/or other modules configured to excite the RF coil(s) 166 and/or receive a signal from the RF coil(s) 166.

The MRI subsystem 154 may be controlled in real-time by the control sequencer 152 to generate magnetic and/or RF fields that stimulate magnetic resonance phenomena in a subject P to be imaged, for example to implement MRI sequences in accordance with various examples of the present disclosure. An image of an area of interest A of the subject P may be shown on display 158 coupled to or integral with the DADC 150. The display 158 may be implemented through a variety of output interfaces, including a monitor, printer, and/or data storage device, for example.

The area of interest A corresponds to a region associated with one or more structures or physiological activities in subject P in some examples. The area of interest shown in the example of FIG. 1A corresponds to a chest region of subject P, but it should be appreciated that the area of interest for purposes of implementing various aspects of this technology is not limited to the chest area. It also should be appreciated that the area of interest may encompass various areas of subject P associated with various structural or physiological characteristics, such as, but not limited to the heart region, brain region, upper or lower extremities, or other organs or tissues.

Figure 1B:
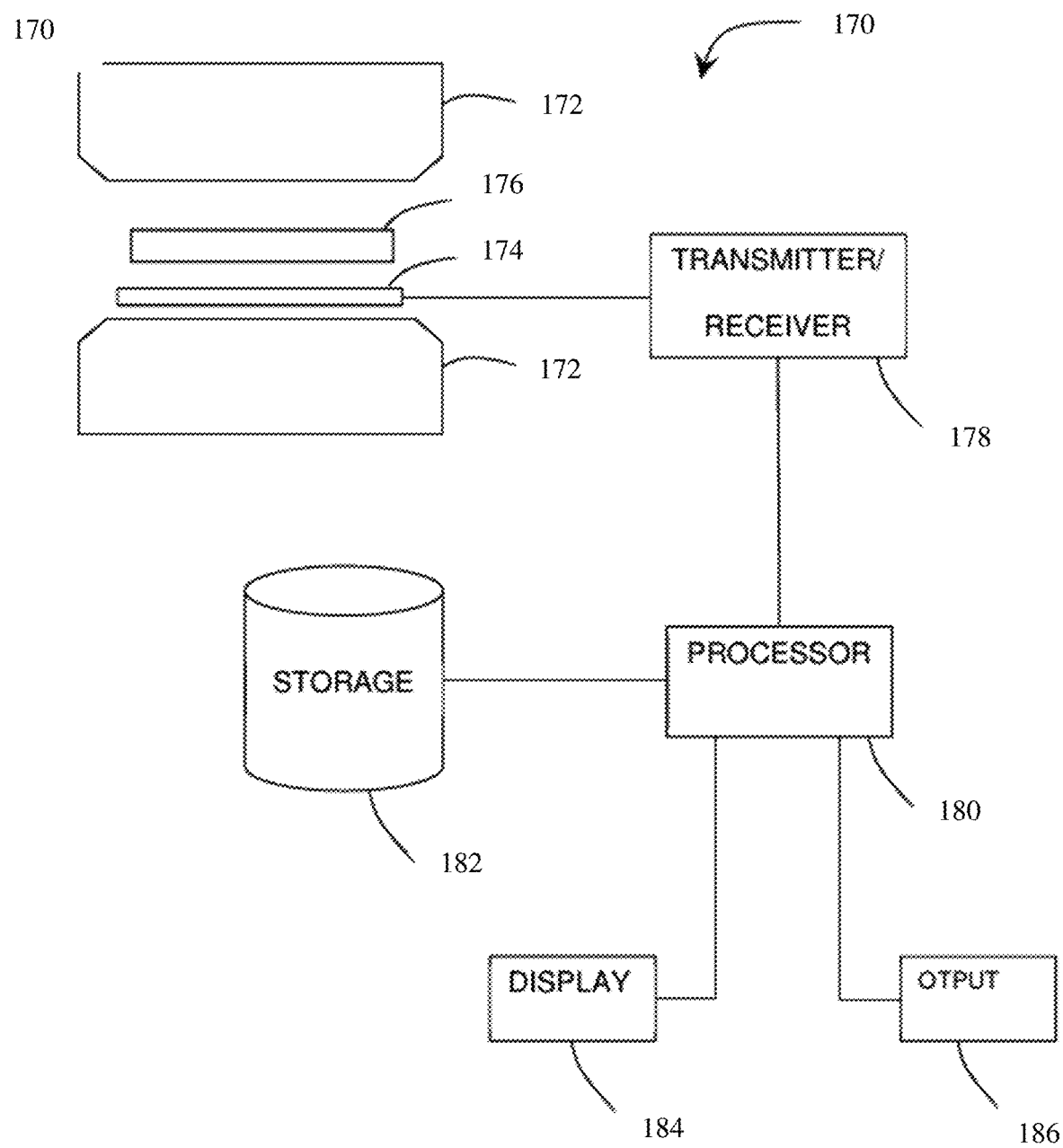

Referring to FIG. 1B, another MRI system 170 is illustrated. The system 170, or selected parts thereof, can be referred to as an MR scanner. Various embodiments as disclosed herein, or any other applicable embodiments as desired or required, can be implemented within the MRI system 170. The MRI system 170, in one example, has a magnet 172. The magnet 172 can provide a biasing magnetic field. A coil 174 and subject 176 are positioned within the field of magnet 172. The subject 176 can include a human body, an animal, a phantom, or other specimen.

The coil 174 can include a transmit coil, a receive coil, a separate transmit coil and receive coil, or a transceiver coil. The coil 174 is in communication with a transmitter/receiver unit 178 and with a processor 180. In various examples, the coil 174 both transmits and receives RF signals relative to subject 176. The transmitter/receiver unit 178 can include a transmit/receive switch, an analog-to-digital converter (ADC), a digital-to-analog converter (DAC), an amplifier, a filter, or other modules configured to excite coil 174 and to receive a signal from the coil 174.

The processor 180 can include a digital signal processor, a microprocessor, a controller, or other module. The processor 180, in one example, is configured to generate an excitation signal (for example, a pulse sequence) for the coil 174. The processor 180, in one example, is configured to perform a post-processing operation on the signal received from the coil 174. The processor 180 is also coupled to storage 182, display 184 and output unit 186.

The storage 182 can include a memory for storing data. The data can include image data as well as results of processing performed by the processor 180. In one example, the storage 182 provides storage for executable instructions for use by the processor 180. The instructions can be configured to generate and deliver a particular pulse sequence or to implement a particular algorithm, as described and illustrated in more detail below.

The display 184 can include a screen, a monitor, or other device to render a visible image corresponding to the subject 176. For example, the display 184 can be configured to display a radial projection, photographic or video depictions, two-dimensional images, or other view corresponding to subject 176. The output unit 186 can include a printer, a storage device, a network interface or other device configured to receive processed data.

The system 170 may include the MRI coil 174 for taking raw image data from the subject 176, the processor 180 may be capable for performing any of the operations described herein, the output 186 may be capable for outputting the image, and the display 184 may be capable for displaying the image. The output 186 can include one or more of a printer, storage device and a transmission line for transmitting the image to a remote location. Code for performing the above operations can be supplied to the processor 180 on a non-transitory machine-readable medium or any suitable computer-readable storage medium. The machine-readable medium includes executable instructions stored thereon for performing any of the methods disclosed herein or as desired or required for aspects of the technology described and illustrated herein.

Figure 2:
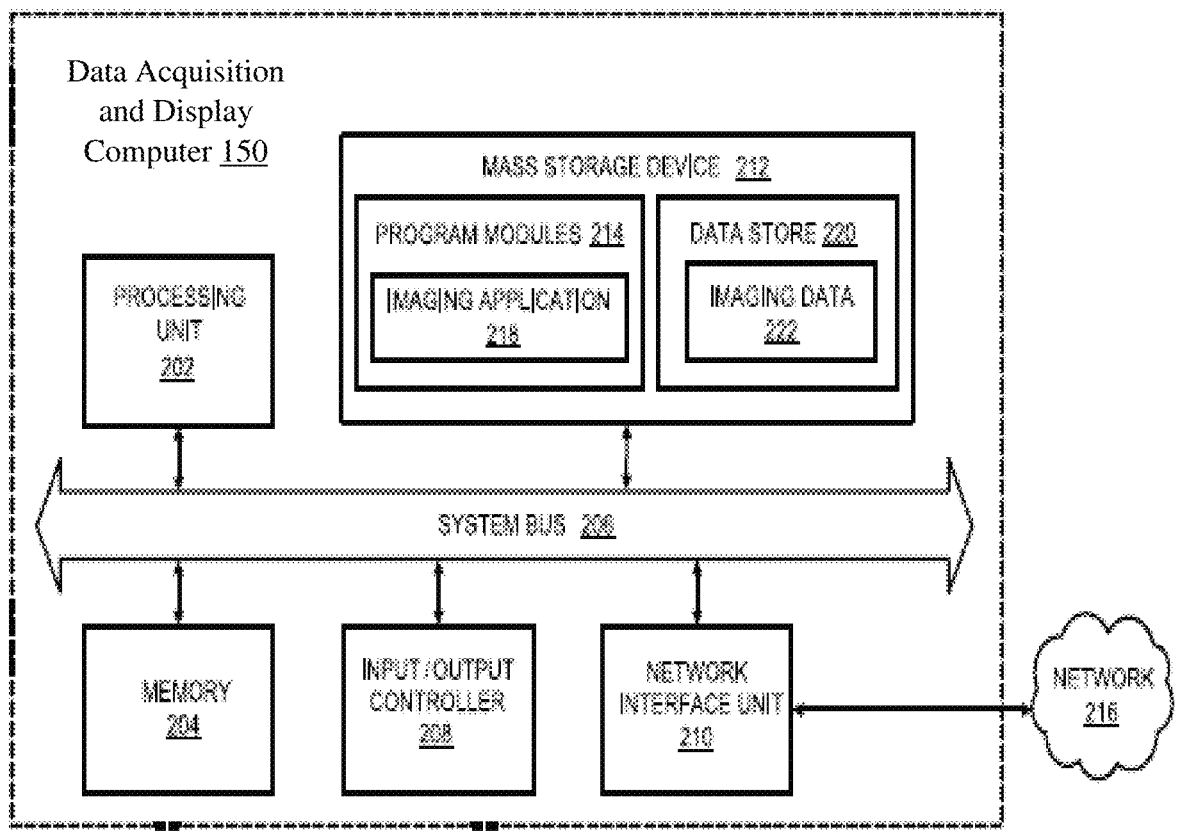
FIG. 2 is a block diagram of an exemplary data acquisition and display computer of the exemplary MRI system of FIG. 1A.

Referring to FIG. 2, a block diagram of the exemplary DADC 150 is disclosed. The DADC 150 is capable of implementing aspects of the disclosed technology in accordance with one or more examples described herein. The DADC 150 may be configured to perform one or more functions associated with examples described and illustrated herein with reference to FIGS. 3-9. It should be appreciated that the DADC 150 may be implemented within a single computing device or a computing system formed with multiple connected computing devices. The DADC 150 may be configured to perform various distributed computing tasks, in which processing and/or storage resources may be distributed among the multiple devices.

The DADC 150 in this particular example includes a processing unit 202, a system memory 204, and a system bus 206 that couples the system memory 204 to the processing unit 202. The processing unit 202 can include a central processing unit (CPU), processor(s), and/or special purpose logic circuitry (e.g., a field programmable gate array (FPGA) and/or an application-specific integrated circuit (ASIC))). The system bus 206 may enable the processing unit 202 to read code and/or data to/from a mass storage device 212 or other computer-storage media 212 storing program modules 214.

The mass storage device 212 is connected to the processing unit 202 through a mass storage controller (not shown) connected to the system bus 206. The mass storage device 212 and its associated computer-storage media provide non-volatile storage for the DADC 150. Although the description of computer-storage media contained herein refers to a mass storage device, such as a hard disk or solid state drive, it should be appreciated by those skilled in the art that computer-storage media can be any available computer storage media that can be accessed by the DADC 150.

By way of example only, the mass storage device 212 may include volatile and/or non-volatile, removable and/or non-removable media implemented in any method or technology for storage of information such as computer-storage instructions, data structures, program modules, or other data. For example, computer storage media can include RAM, ROM, EPROM, EEPROM, flash memory or other solid state memory technology, or other optical storage, magnetic cassettes, magnetic tape, magnetic disk storage or other magnetic storage devices, or any other medium which can be used to store the desired information and which can be accessed by the DADC 150.

Accordingly, examples of this technology can be implemented in digital electronic circuitry, in computer hardware, in firmware, in software, or in any combination thereof. Examples can be implemented using a computer program product (e.g., a computer program, tangibly embodied in an information carrier or in a machine readable medium, for execution by, or to control the operation of, the processing unit 202 and/or the processor 180). The computer program can be written in any programming language, including compiled or interpreted languages, and it can be deployed in any form, including as a stand-alone program or as a software module, subroutine, or other unit suitable for use in a computing environment.

Thus, the examples of the technology described and illustrated herein may be embodied as one or more non-transitory computer or machine readable media, such as the mass storage device 212, having machine or processor-executable instructions stored thereon for one or more aspects of the present technology, which when executed by processor(s), such as processing unit 202 and/or processor 180, cause the processor(s) to carry out the steps necessary to implement the methods of this technology, as described and illustrated with the examples herein. In some examples, the executable instructions are configured to perform one or more steps of a method, such as one or more of the exemplary methods described and illustrated below with reference to FIGS. 3-9, for example.

According to various examples of this technology, the DADC 150 may operate in a networked environment using connections to other local or remote computers through a network 216 via a network interface unit 210 connected to the system bus 206. The network interface unit 210 may facilitate connection of the computing device inputs and outputs to one or more suitable networks and/or connections such as a local area network (LAN), a wide area network (WAN), the Internet, a cellular network, a radio frequency (RF) network, a Bluetooth-enabled network, a Wi-Fi enabled network, a satellite-based network, or other wired and/or wireless networks for communication with external devices and/or systems.

The DADC 150 may also include an input/output controller 208 for receiving and processing input from any of a number of input devices. Input devices may include one or more of keyboards, mice, stylus, touchscreens, microphones, audio capturing devices, and image/video capturing devices. An end user may utilize the input devices to interact with a user interface, for example a graphical user interface, for managing various functions performed by the DADC 150.

The program modules 214 may include instructions operable to perform tasks associated with examples illustrated in one or more of FIGS. 3-9. The program modules 214 may include an imaging application 218 for performing data acquisition and/or processing functions as described herein, for example to instruct the control sequencer 152 and/or acquire and/or process image data corresponding to magnetic resonance imaging an area of interest A. The DADC 150 can include a data store 220 for storing data that may include imaging-related data 222 such as acquired data from the implementation of MRI pulse sequences in accordance with various examples of the present disclosure.

Referring back to FIG. 1A, the operation of the MRI system 100 in some examples is controlled from the operator console 110, which includes one or more processors coupled to memory (e.g., a non-transitory computer readable medium) via a system bus and configured to execute programmed instructions stored in the memory to carry out one or more steps of the technology disclosed herein. The operator console 110 can also include keyboard, a control panel, and/or a display. The operator console 110 communicates through a link with the DADC 150 to enable an operator to control the operation of the control sequencer 152 and production and display of images on the screen 158. In other examples, the operator console 110 can communicate directly with the control sequencer 152 to control one or more aspects of the MRI subsystem 154.

Thus, in some examples, the DADC 150 receives commands from the operator console 110 that indicate the scan sequence and/or other parameters of the scan that is to be performed. The control sequencer 152, which is also referred to as a pulse generator, then operates the MRI system 100 components to carry out the desired scan sequence. In some examples, the DADC 150 produces data that indicates the timing, amplitude, and shape of the RF pulses which are to be produced, and the timing and length of the data acquisition window, which is used to instruct the control sequencer 152. The control sequencer 152 connects to the gradient amplifiers of the gradient subsystem 168, to indicate the timing and shape of the gradient pulses to be produced during the MRI scan.

The gradient waveforms produced by the control sequencer 152 are applied to the gradient amplifiers of the gradient subsystem 168 each of which excites a corresponding gradient coil in the gradient subsystem 168 to produce the magnetic field gradients used for spatially encoding acquired signals. The gradient subsystem 168 forms part of the MRI subsystem 154, which includes a polarizing magnet (e.g., static Z axis magnet 169) and a whole-body RF coil (e.g., RF coil(s) 166) in some examples.

A transceiver (e.g., RF transmitter 162) produces pulses that are amplified by an RF amplifier and coupled to the RF coil(s) 166 by the transmit/receive switch 164. The resulting signals radiated by the excited nuclei in the subject may be sensed by the same RF coil(s) 166 and coupled through the transmit/receive switch 164 to a preamplifier. The amplified signals are demodulated, filtered, and digitized in a receiver (e.g., RF receiver 160). The transmit/receive switch 164 is controlled by a signal from the control sequencer 152 to electrically connect the RF amplifier to the RF coil(s) 166 during the transmit mode and to connect the preamplifier during the receive mode. In some examples, the transmit/receive switch 164 also enables a separate RF coil (e.g., a head coil or surface coil of the RF coil(s) 166) to be used in either the transmit or receive mode.

The signals observed up by the RF coil(s) 166 are digitized by the RF receiver 160 and transferred to the DADC 150. When the scan is completed and an array of data has been acquired by the DADC 150, the processing unit 202 of the DADC 150 operates to transform (e.g., Fourier transform) the data into the imaging data 222 via a reconstruction technique, as described and illustrated in more detail below. In response to commands received from the operator console 110, this imaging data 122 may be archived on the mass storage device 212 or elsewhere, further processed by the processing unit 202, conveyed to the operator console 110 for display, and/or presented on the display 158. The display for operator console 110 and display 158 may be the same physical device.

Figure 3:
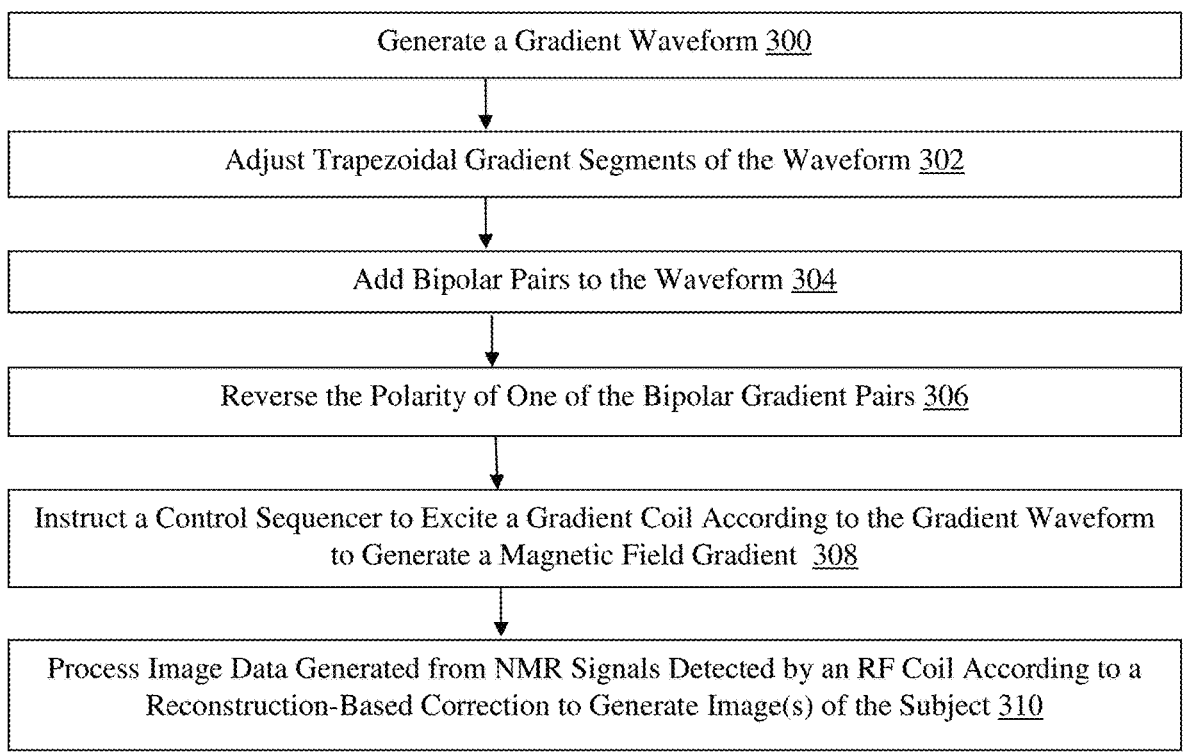
FIG. 3 is a flowchart of an exemplary method for compensating for self-squared Maxwell gradient terms, and for quadratic Maxwell gradient cross-terms associated with added zero-moment waveforms.

Referring to FIG. 3, a flowchart illustrating an exemplary method for compensating for self-squared Maxwell gradient terms, and for quadratic Maxwell gradient cross-terms associated with added zero-moment waveforms, is illustrated. In step 300 in this example, the DADC 150 generates an original encoding gradient waveform (e.g., a spiral waveform). Spiral trajectories for the gradient waveform offer advantages for acquisition speed, SNR efficiency, and robust performance with motion as compared to Cartesian sampling.

Figure 4:
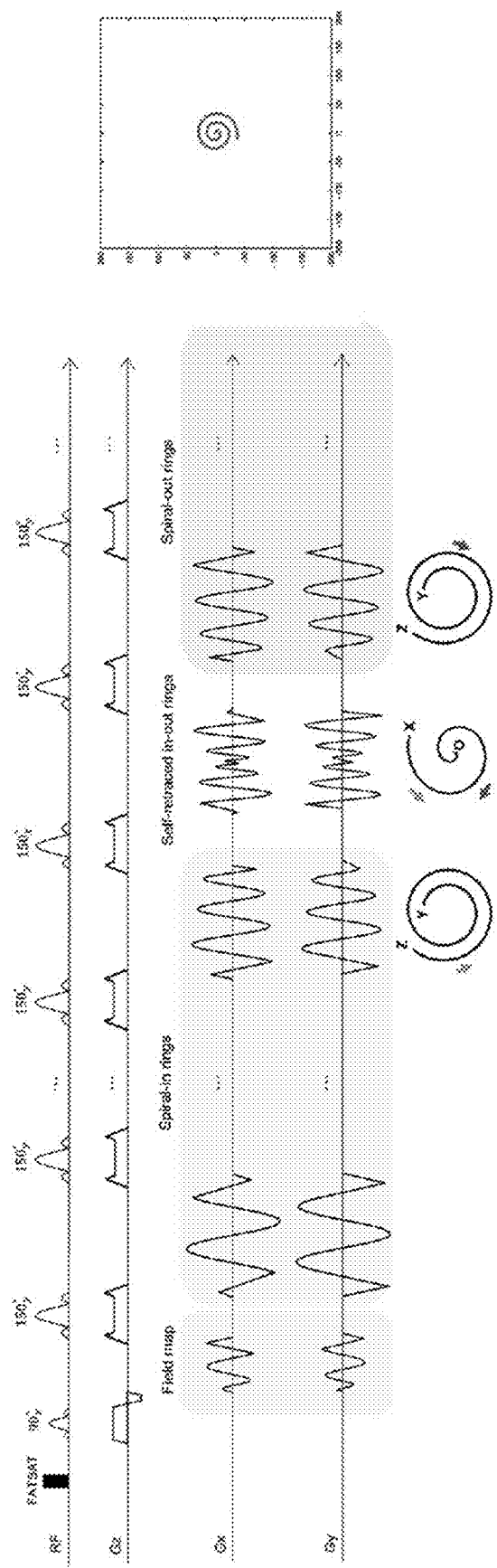
FIG. 4 is an exemplary pulse-sequence diagram of TSE imaging using spiral-rings encoding based on a spiral-in-out trajectory.

Referring to FIG. 4, a pulse-sequence diagram of TSE imaging using spiral-rings encoding based on a spiral-in-out trajectory is illustrated. Although Maxwell gradient effects exist in Cartesian TSE imaging, spiral TSE imaging presents additional challenges because spiral waveforms generally vary along the spin-echo train, as opposed to Cartesian TSE imaging for which the same readout waveform is used for every echo. In particular, the spiral-ring waveforms for each echo vary along the spin-echo train in this example vary differently and are temporally asymmetric, thus differing from Cartesian TSE imaging and interleaved-spiral TSE imaging. At lower magnetic fields, the Maxwell term effects on images associated with spiral-rings can become substantial.

While spiral trajectories (e.g., spiral-out or spiral-in-out) are used in the examples described and illustrated herein, other non-rectilinear trajectories can also be used in other examples. Accordingly, the technology described herein can be used with other trajectory types that are time-varying and asymmetric along the spin-echo train in TSE imaging.

In step 302, the DADC 150 modifies a portion of the original encoding gradient waveform generated in step 300 to generate a modified gradient waveform. In one example, the modified portion is a trapezoidal gradient segment and is at the end of the waveform corresponding to a particular echo. By lengthening or shortening, for example, the trapezoidal gradient segment of the original encoding gradient waveform not concurrent with data sampling and correspondingly decreasing or increasing, respectively, its gradient amplitude, the Maxwell integral can be decreased or increased, respectively, while the original zeroth gradient moment can be maintained.

Figure 5:
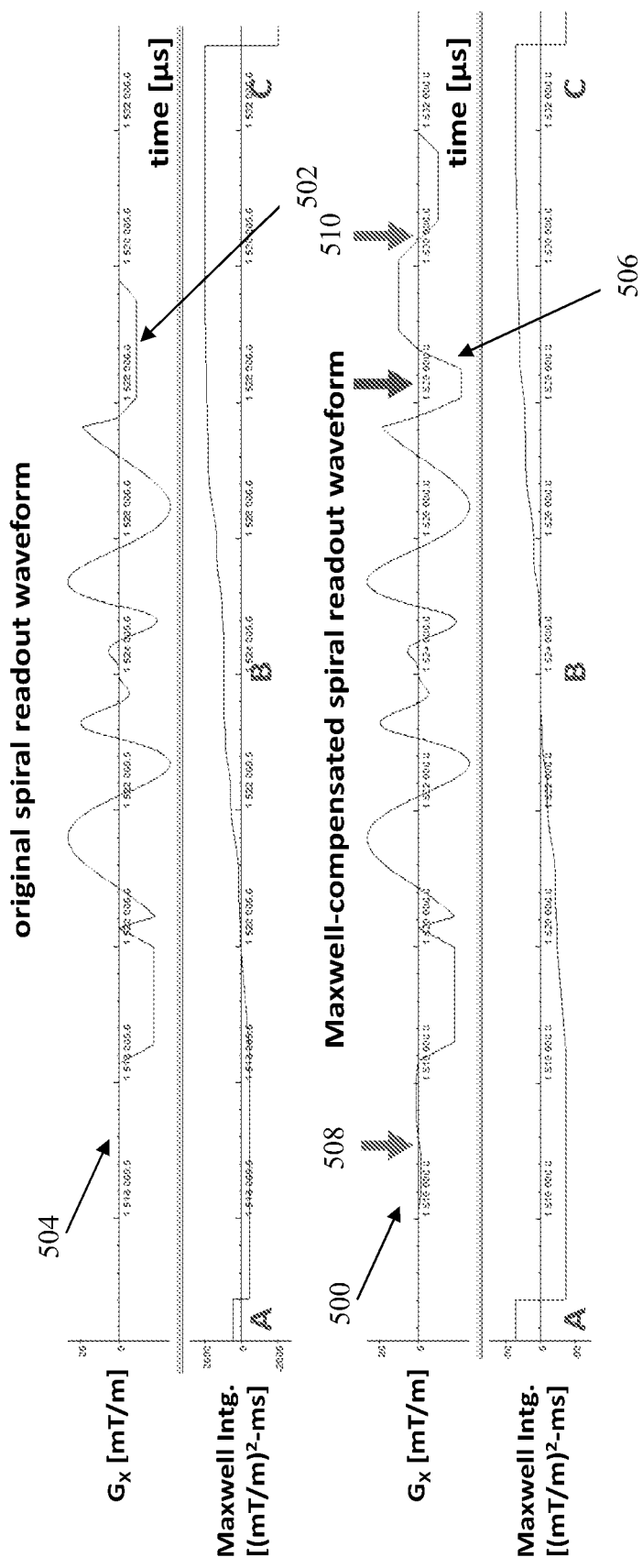
FIG. 5 is an exemplary waveform diagram of a spiral-in-out gradient waveform before (top panel) and after (bottom panel) modification according to the exemplary method of FIG. 3 to compensate for self-squared Maxwell gradient terms.

Referring to FIG. 5, an exemplary waveform diagram of a spiral-in-out gradient waveform 500 before (top panel) and after (bottom panel) modification according to the exemplary method of FIG. 3 to compensate for self-squared Maxwell gradient terms is illustrated. In this example, the trapezoidal gradient segment 502 of the spiral-in-out original encoding gradient waveform 504 is shortened in the modified gradient waveform 500, while the zeroth moment is maintained, to result in the trapezoidal gradient segment 506.

Referring back to FIG. 3, in step 304, the DADC 150 adds one or more zero-moment waveform segments to the modified gradient waveform resulting from the modification introduced to the original encoding gradient waveform in step 302. In one example, the added zero-moment waveform segments can be two bipolar gradient pairs, one at either end (i.e., one or both opposing ends) of the waveform resulting from step 302, but other types of waveform segments can be added in other examples.

Since gradient duration is a discrete variable, and changes in Maxwell integral achievable by modifying portions of the original encoding gradient waveform are limited, the change in Maxwell integral required to facilitate a desired substantially zero Maxwell integral at the spin-echo time, and a desired substantially equivalent Maxwell-integral magnitude at the beginning and end of the gradient waveform, may not be achieved by only modifying portion(s) (e.g., trapezoidal gradient segment) of the original encoding gradient waveform. Accordingly, in this particular example, adding bipolar gradient pairs permits the Maxwell integral to be modified to the extent necessary while the original zeroth moment is maintained.

To generate the characteristics (e.g., shape and amplitude) of the bipolar gradient pairs in some examples, the DADC 150 determines, for each excitation or shot, the maximum Maxwell field integral M_max from self-squared terms for each gradient axis (e.g. $g_x$ and $g_y$) from the spiral-ring or other original encoding gradient waveform with the highest gradient amplitude or maximum Maxwell integral, respectively. The DADC 150 then determines the amplitudes and durations of the bipolar gradient pairs based on the difference between the Maxwell field integral $M_i$ for the current ith ring and $M_{max}$. Additionally, in this example, the DADC 150 constrains the magnitude of the Maxwell integral at the beginning and end of each modified gradient waveform to be a constant value of $M_{max}/2$.

Referring back to FIG. 5, a first bipolar gradient pair 508 is added at the beginning of the modified gradient waveform 500 and a second bipolar gradient pair 510 is added at the end of the modified gradient waveform 500. The added first and second bipolar gradient pairs 508 and 510, respectively, each have a zeroth moment equal to zero.

As illustrated in FIG. 5 with respect to the original encoding gradient waveform 504, without the Maxwell term compensation described and illustrated by way of the examples herein, the Maxwell integrals at times A and C (i.e., the beginning and end) are not equal in magnitude and the Maxwell integral at time B (i.e., the spin-echo time) is not zero. However, as illustrated with respect to the modified gradient waveform 500, with the Maxwell term compensation described and illustrated by way of the examples herein, the Maxwell integral magnitude at times A and C are substantially equal and the Maxwell integral at time B is substantially zero.

While only one gradient axis (i.e., $g_x$) is illustrated in FIG. 5, the corresponding waveform, modified as described with reference to steps 302 and 304, can be implemented with respect to another gradient axis (e.g., $g_y$) in the two-dimensional MRI of the examples described herein. Accordingly, by modifying the trapezoidal gradient segment 502, as explained with reference to step 302, and adding the bipolar gradient pairs 508 and 510, as explained with reference to 304, this technology advantageously reduces the phase shift from the Maxwell self-squared terms at each echo and reduces the difference in phase shifts among echo spacings.

Figure 6:
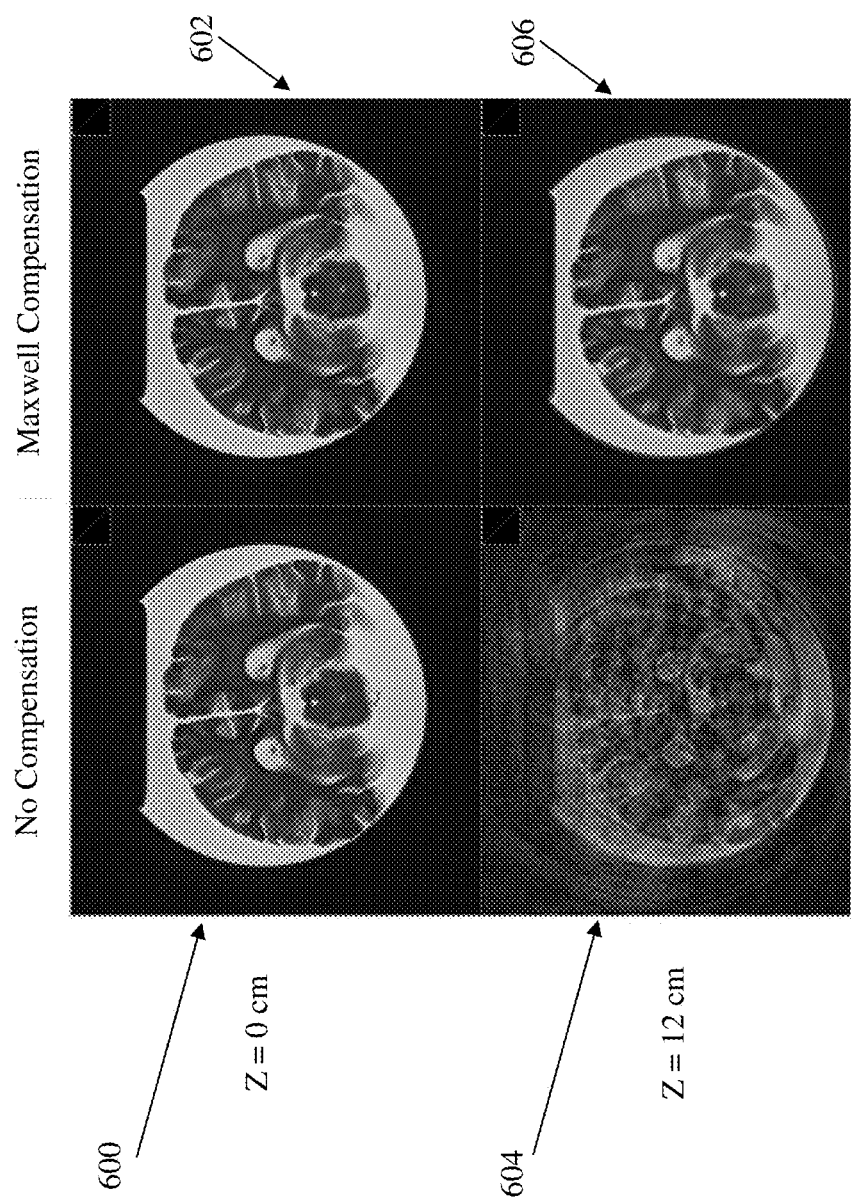
FIG. 6 is a set of turbo spin-echo (TSE) images using an interleaved spiral-out trajectory with and without compensation for self-squared Maxwell gradient terms according to the exemplary method of FIG. 3.

Referring to FIG. 6, a set of TSE images using an interleaved spiral-out trajectory with and without compensation for self-squared Maxwell gradient terms according to the exemplary method of FIG. 3 is illustrated. While a first uncompensated image 600 and a first compensated image 602 show no significant artifacts at slice position z=0 cm, the second uncompensated image 604 shows substantial artifacts at slice position z=12 cm. In the second compensated image 606, no significant artifacts are seen at slice position z=12 cm. In this example, the waveforms used for the $g_x$ and $g_y$ gradient axes were modified according to steps 302-304 of FIG. 3 to compensate for the self-squared Maxwell gradient terms resulting in the relatively higher quality first and second compensated images 602 and 606, respectively, that are generated during image reconstruction.

Figures 7A, 7B:
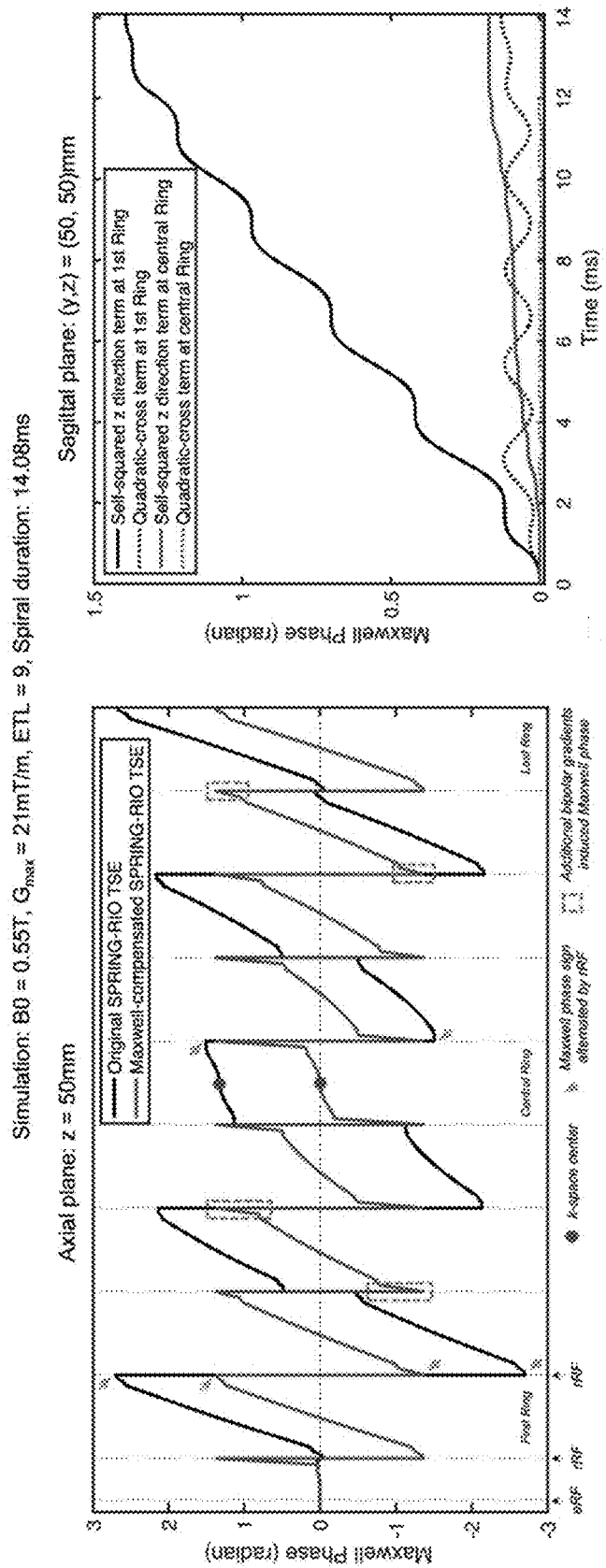
FIGS. 7A-B illustrate exemplary simulation results showing the Maxwell phase accruals along the spin-echo train and during the spiral readouts for TSE imaging using spiral-rings encoding based on a spiral-in-out trajectory.

Referring to FIGS. 7A-B, exemplary simulation results showing the Maxwell phase accruals along the spin-echo train and during the spiral readouts are illustrated for TSE imaging using spiral-rings encoding based on a spiral-in-out trajectory. While adding the bipolar gradient pairs achieves an increase in the Maxwell integral while maintaining the original zeroth moment, and results in improved image quality over uncompensated images, the quadratic Maxwell gradient cross-terms from the added bipolar gradient pairs are relatively large and therefore negatively impact image quality.

Referring more specifically to FIG. 7A, in this particular example, the Maxwell phase pathway from the self-squared Maxwell gradient terms along the spin-echo train with (blue) and without (black) sequence modifications in the axial plane are illustrated. eRF and rRF denote excitation and refocusing RF pulses, respectively. The red circles denote the k-space center, while the orange arrows denote the effects of selected refocusing RF pulses, which alternate the sign of the phase error throughout the spin-echo train.

After adding compensation gradients, the accrued phase for each echo spacing starts at −ϕ and ends at ϕ, where ϕ is a constant value, and the phase at the k-space center (and at all other spin-echoes) is zero. The green dashed boxes indicate examples of the result of increased Maxwell phase by added bipolar gradients (e.g., analogous to first bipolar gradient pair 508 and second bipolar gradient pair 510).

Referring more specifically to FIG. 7B, the outer rings produce larger self-squared terms than the inner rings and the self-squared Maxwell gradient terms in this example are substantially larger than the quadratic Maxwell gradient cross-terms. Specifically, the first ring produces the largest Maxwell phase accrual while the central ring has the smallest value. For the sagittal scan example, the quadratic Maxwell gradient cross-term is relatively small compared to the self-squared Maxwell gradient term.

Referring back to FIG. 3, in step 306, the DADC 150 optionally further modifies the gradient waveform generated in step 304 by reversing the polarity of one of the bipolar gradient pairs for the case when four bipolar gradient pairs are added in step 304 across the two gradient axes (e.g., $g_x$ and $g_y$) within a given echo spacing. By setting the polarity of one of the four added bipolar gradient pairs of the gradient waveform associated with the echo spacing to be the opposite of the other three of the four added bipolar gradient pairs, a self-balancing of the quadratic Maxwell gradient cross-terms induced by the four added bipolar gradient pairs is achieved.

Figure 8:
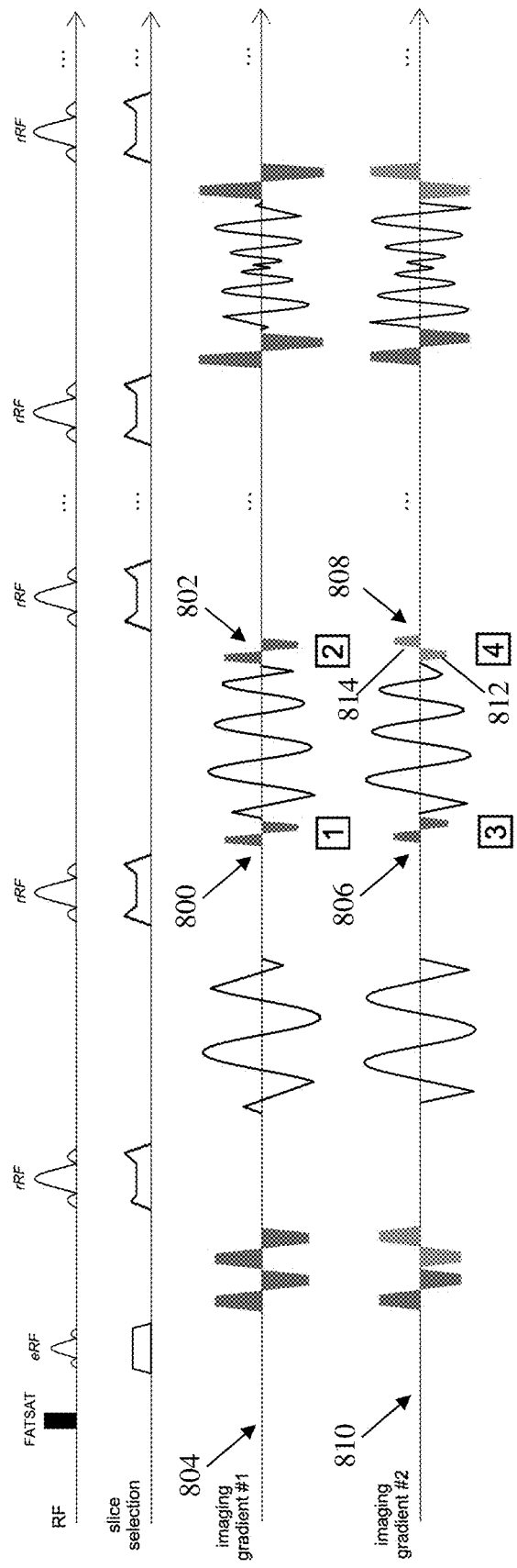
FIG. 8 is an exemplary pulse-sequence diagram of TSE imaging using spiral-rings encoding based on a spiral-in-out trajectory and incorporating bipolar gradient pairs that compensate for self-squared Maxwell gradient terms and for quadratic Maxwell gradient cross-terms associated with added bipolar waveforms.

Referring to FIG. 8, an exemplary pulse-sequence diagram of TSE imaging using spiral-rings encoding based on a spiral-in-out trajectory and incorporating bipolar gradient pairs that compensate for self-squared Maxwell gradient terms and for quadratic Maxwell gradient cross-terms associated with added bipolar waveforms is illustrated. In this particular example, a first bipolar pair 800 and a second bipolar pair 802 are added to one of the echo spacings of a first imaging gradient 804, which can be associated with one gradient axis (e.g., $g_x$). Additionally, a third bipolar pair 806 and a fourth bipolar pair 808 are added to the same one of the echo spacings of a second imaging gradient 810, which can be associated with a different gradient axis (e.g., $g_y$).

In this example, the polarity of the fourth bipolar pair 808 is reversed as compared to the polarity of the first, second, and third bipolar pairs 800, 802, and 806, respectively. More specifically, the fourth bipolar gradient 808 has a negative lobe 812 before a positive lobe 814 whereas each of the first, second, and third bipolar pairs 800, 802, and 806, respectively, has a positive lobe before a negative lobe.

Referring back to FIG. 3, in step 308, the DADC 150 instructs the control sequencer 152 to excite the coil(s) of the gradient subsystem 168 according to the gradient waveform to generate a magnetic field gradient, optionally in two gradient axes (i.e., $g_x$ and $g_y$). In some examples, the operator console 110 can be used to establish, or the DADC 150 can be configured to determine, additional time to be added to the echo spacing to achieve compensation as a result of the gradient waveform modifications of, or gradient waveform segments (e.g., bipolar gradients) added to, the original encoding gradient waveform generated in step 300.

In step 310, the DADC 150 obtains and digitizes image data following detection of nuclear magnetic resonance (NMR) signals by RF coil (e.g., RF coil(s) 166). The DADC 150 then processes the image data to generate image(s) of the subject, optionally applying corrections for Maxwell phase shift accrual during sampling and/or phase accrual during sampling due to off-resonance effects. In one particular example, the DADC 150 reconstructs the images by, for the axial orientation, demodulating imaging data from each interleave or ring by multiplying its own Maxwell phase shift by a factor of $e^{-i\phi_c(z,t)}$, where $$\phi_c(z,t) = \frac{\gamma z^2}{2B_0}\int_0^\tau \left(g_x^2(t') + g_y^2(t')\right)dt'. \quad \phi_c(z,t) = \frac{\gamma z^2}{2B_0}\int_0^\tau \left(g_x^2(t') + \left(g_x^2(t') + g_y^2(t')\right)\right)dt'$$

For sagittal and coronal orientations, the DADC 150 in some examples demodulates the imaging data in an analogous manner as for the axial orientation and then performs multi-frequency interpolation (MFI) to mitigate the in-plane blurring caused by spatial and time dependent Maxwell term phase error.

In one particular example for spiral-ring encoding described with respect to the sagittal orientation, the $x^2$ component $$\frac{\gamma x^2}{2B_0}\int_0^\tau \left(\frac{g_z^2}{8B_0}\right)dt'$$

is removed. Then, for each ring (1) a scaled Maxwell term time parameter $t_c(t)$ for each spiral ring trajectory is calculated $$t_c(t) = \frac{1}{g_m^2}\int_0^\tau g_0^2(t')dt'$$

and (2) a time-independent frequency offset $f_c(y,z)$ is given by $$f_c(y,z) = \frac{\gamma g_m^2}{2\pi 4B_0}\left(\frac{y^2}{4} + z^2\right).$$

The Maxwell term map of the sagittal plane can be generated based on this equation, and MFI deburring can then be applied to correct the offsets induced by Maxwell terms by partitioning the range of constant frequency offsets $f_c(y,z)$ into bins.

For a general oblique orientation, the DADC 150 can calculate the Maxwell term map as a time-independent frequency offset $f_c(X,Y,Z)$ given by $$f_c(X,Y,Z) = \frac{\gamma g_m^2}{2\pi 4B_0}\left(F_1X^2 + F_2Y^2 + F_3Z^2 + F_4YZ + F_5XZ + F_6XY\right),$$

where the $F_i$ are constants calculated from the rotation matrix used to rotate from the logical to the physical coordinate system. Other methods for facilitating reconstruction-based correction to generate the TSE images can also be used in other examples.

Figure 9:
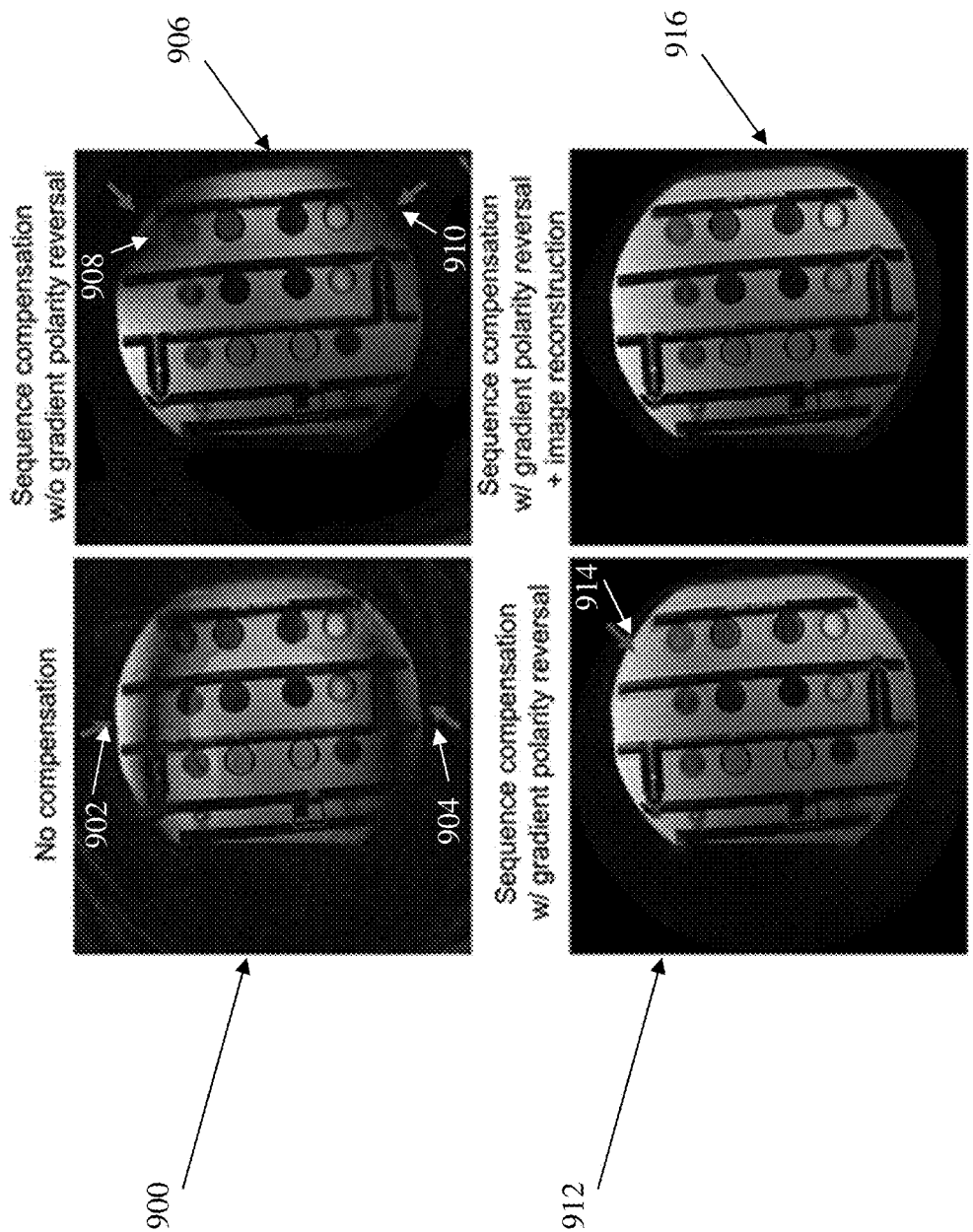
FIG. 9 illustrates another set of TSE images, using spiral-rings encoding based on a spiral-in-out trajectory, without compensation (upper left), with compensation for self-squared Maxwell gradient terms (upper right), with additional compensation for quadratic Maxwell gradient cross-terms associated with added bipolar waveforms (lower left), and with additional compensation during reconstruction (lower right), according to the exemplary method of FIG. 3.

Referring to FIG. 9, another set of TSE images, using spiral-rings encoding based on a spiral-in-out trajectory, with and without compensation (upper left), with compensation for self-squared Maxwell gradient terms (upper right), with additional compensation for quadratic Maxwell gradient cross-terms associated with added bipolar waveforms (lower left), and with additional compensation during reconstruction (lower right), is illustrated. In a first image 900, no Maxwell compensation was applied during acquisition of the image data and first and second artifacts 902 and 904, respectively, are present, among others. In a second image 906, compensation was applied, as explained above with reference to steps 302-304 of FIG. 3, but the polarity reversal of one of the added bipolar gradient pairs described above with reference to step 306 of FIG. 3 was not applied. In the second image 906, though of higher quality than the first image 900, third and fourth artifacts 908 and 910, respectively, are present.

In a third image 912, compensation was applied as explained above with reference to steps 302-306 of FIG. 3, including the polarity reversal of one of the added bipolar gradient pairs, which resulted in improved image quality as compared to the second image 906, although a minor fifth artifact 914 was present. In a fourth image 916, compensation was applied as explained above with reference to steps 302-306 of FIG. 3 and the fourth image 914 was reconstructed as explained with reference to step 310 of FIG. 3, resulting in a higher quality image as compared to the third image 912; image 914 had no significant artifacts.

As described and illustrated by way of the examples herein, the interleaved-spiral and spring-rings T2-weighted 2D-TSE pulse-sequence examples of this technology advantageously incorporate gradient waveform modifications to compensate the self-squared Maxwell gradient terms and, optionally, quadratic Maxwell gradient cross-terms associated with added zero-moment waveforms, at both the echoes and over echo spacings. This technology provides substantial improvement in image quality at relatively low magnetic field strength (e.g., 0.55 T and 1.5 T) for degradation associated with concomitant-gradient effects during TSE acquisitions. The sequence-based compensation of this technology also corrects for echo-by-echo phase variations, while maintaining the CPMG condition, and provides image reconstruction-based compensation that mitigates the residual Maxwell term-induced phase error along the readout window.

It should be appreciated that any number or type of computer-based medical imaging systems or components, including various types of commercially available medical imaging systems and components, may be used to practice certain aspects of the disclosed technology. Systems as described herein with respect to example embodiments are not intended to be specifically limited to MRI implementations or the particular system shown in FIG. 1A-B.

Although examples of this technology are explained in some instances in detail herein, it is to be understood that other examples are contemplated. Accordingly, it is not intended that the present disclosure be limited in its scope to the details of construction and arrangement of components set forth in the foregoing description or illustrated in the drawings. The present disclosure is capable of other embodiments and of being practiced or carried out in various ways.

It should be appreciated that any of the components or modules referred to with regards to any of the examples discussed herein, may be integrally or separately formed with one another. Further, redundant functions or structures of the components or modules may be implemented. Moreover, the various examples may be communicated locally and/or remotely with any user/clinician/patient or machine/system/computer/processor. Moreover, the various components may be in communication via wireless and/or hardwire or other desirable and available communication means, systems and hardware. Moreover, various components and modules may be substituted with other modules or components that provide similar functions.

It should be appreciated that the devices and related components discussed herein may take on all shapes along the entire continual geometric spectrum of manipulation of x, y and z planes to provide and meet the anatomical, environmental, and/or structural demands and operational requirements. Moreover, locations and alignments of the various components may vary as desired or required. It should also be appreciated that various sizes, dimensions, contours, rigidity, shapes, flexibility and materials of any of the components or portions of components in the various embodiments discussed throughout may be varied and utilized as desired or required. Additionally, it should be appreciated that while some dimensions are provided on the aforementioned figures, any of the device may constitute various sizes, dimensions, contours, rigidity, shapes, flexibility and materials as it pertains to the components or portions of components of the device, and therefore may be varied and utilized as desired or required.

In describing the examples herein, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

As discussed herein, a "subject" may be any applicable human, animal, or other organism, living or dead, or other biological or molecular structure or chemical environment, and may relate to particular components of the subject, for instance specific tissues or fluids of a subject (e.g., human tissue in a particular area of the body of a living subject), which may be in a particular location of the subject, referred to herein as an "area of interest" or a "region of interest." It should be appreciated that an animal may be a variety of any applicable type, including, but not limited thereto, mammal, veterinarian animal, livestock animal or pet type animal, etc. As an example, the animal may be a laboratory animal specifically selected to have certain characteristics similar to human (e.g. rat, dog, pig, monkey), etc. It should be appreciated that the subject may be any applicable human patient, for example.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g. 1 to 5 includes 1, 1.5, 2, 2.75, 3, 3.90, 4, 4.24, and 5). Similarly, numerical ranges recited herein by endpoints include subranges subsumed within that range (e.g. 1 to 5 includes 1-1.5, 1.5-2, 2-2.75, 2.75-3, 3-3.90, 3.90-4, 4-4.24, 4.24-5, 2-5, 3-5, 1-4, and 2-4). It is also to be understood that all numbers and fractions thereof are presumed to be modified by the term "about."

Having thus described the basic concepts of the disclosed technology, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A method for turbo spin-echo (TSE) imaging of a subject, the method implemented by one or more computing devices and comprising:
    generating a radio frequency (RF) excitation pulse to produce transverse magnetization that generates a nuclear magnetic resonance (NMR) signal and a series of RF refocusing pulses to produce a corresponding series of NMR spin-echo signals;
    modifying an original encoding gradient waveform comprising a non-rectilinear encoding trajectory by:
        introducing at least one zero zeroth-moment waveform segment comprising two bipolar pairs at one or both ends of the original encoding gradient waveform; and
        reversing a polarity of one of the two bipolar pairs for one of a first gradient axis or a second gradient axis different from the first gradient axis;
    generating during an interval adjacent to each of the series of RF refocusing pulses a first gradient pulse and a second gradient pulse, wherein:
        at least one of the first or second gradient pulses is generated according to the modified gradient waveform; and
        the first and second gradient pulses encode the NMR spin-echo signals corresponding to the first gradient axis and the second gradient axis, respectively; and
    constructing an image from generated digitized samples of the NMR spin-echo signals obtained based on the encoding.

2. The method of claim 1, wherein the non-rectilinear encoding trajectory comprises interleaved spiral or spiral rings or a spiral trajectory comprising a spiral-out, a spiral-in, or a spiral-in-out trajectory.

3. The method of claim 1, further comprising adjusting at least a portion of the original encoding gradient waveform that comprises a trapezoidal gradient segment that is not concurrent with data sampling, wherein the trapezoidal gradient segment is at one of the opposing ends prior to the introduction of the at least one zero zeroth-moment waveform segments and the method further comprises increasing or decreasing the length of the trapezoidal gradient segment, while concurrently decreasing or increasing its amplitude, respectively, to increase or decrease a Maxwell integral of the original encoding gradient waveform.

4. The method of claim 1, wherein a Maxwell integral is substantially zero at a spin-echo time associated with the modified encoding gradient waveform and a magnitude of the Maxwell integral is substantially equal at each of a beginning and an end of the modified encoding gradient waveform.

5. A computing device, comprising memory comprising programmed instructions stored thereon and one or more processors configured to execute the stored programmed instructions to:
    generate a radio frequency (RF) excitation pulse to produce transverse magnetization that generates a nuclear magnetic resonance (NMR) signal and a series of RF refocusing pulses to produce a corresponding series of NMR spin-echo signals;
    modify an original encoding gradient waveform comprising a non-rectilinear encoding trajectory by:
        introducing at least one zero zeroth-moment waveform segment at one or both ends of the original encoding gradient waveform, wherein the original encoding gradient waveform comprises a trapezoidal gradient segment that is not concurrent with data sampling and is at one of the ends prior to the introduction of the at least one zero zeroth-moment waveform segment; and
        increasing or decreasing the length of the trapezoidal gradient segment, while concurrently decreasing or increasing its amplitude, respectively, to increase or decrease a Maxwell integral of the original encoding gradient waveform;
    generate during an interval adjacent to each of the series of RF refocusing pulses a first gradient pulse, wherein at least one of the first gradient pulses is generated according to the modified gradient waveform and the first gradient pulses encode the NMR spin-echo signals; and
    construct an image from generated digitized samples of the NMR spin-echo signals obtained based on the encoding.

6. The computing device of claim 5, wherein the first gradient pulses encode the NMR spin-echo signals corresponding to a first gradient axis.

7. The computing device of claim 6, wherein the one or more processors are further configured to execute the stored programmed instructions to generate during the interval adjacent to each of the series of RF refocusing pulses a second gradient pulse, wherein at least one of the second gradient pulses is generated according to the modified encoding gradient waveform and the second gradient pulses encode the NMR spin-echo signals corresponding to a second gradient axis different from the first gradient axis.

8. The computing device of claim 7, wherein the at least one zero zeroth-moment waveform segments comprise two bipolar pairs and the one or more processors are further configured to execute the stored programmed instructions to reverse the polarity of one of the two bipolar pairs for one of the first or second gradient axes.

9. The computing device of claim 5, wherein the non-rectilinear encoding trajectory comprises interleaved spiral or spiral rings or a spiral trajectory comprising a spiral-out, a spiral-in, or a spiral-in-out trajectory.

10. The computing device of claim 5, wherein a Maxwell integral is substantially zero at a spin-echo time associated with the modified encoding gradient waveform and a magnitude of the Maxwell integral is substantially equal at each of a beginning and an end of the modified encoding gradient waveform.

11. A magnetic resonance imaging (MRI) system, comprising:
- a control sequencer coupled to a gradient subsystem comprising gradient amplifiers and gradient coils and an MRI subsystem comprising a static z-axis magnet and one or more radio frequency (RF) coils; and
- a data acquisition and display (DADC) device comprising memory comprising programmed instructions stored thereon and one or more processors configured to execute the stored programmed instructions to:
  - generate a RF excitation pulse to produce transverse magnetization that generates a nuclear magnetic resonance (NMR) signal and a series of RF refocusing pulses to produce a corresponding series of NMR spin-echo signals;
  - modify an original encoding gradient waveform comprising a non-rectilinear encoding trajectory by one or more of:
    - adjusting at least a portion of the original encoding gradient waveform while maintaining substantially the same zeroth moment for the at least a portion of the original encoding gradient waveform; or
    - introducing at least one additional waveform segment, having a zeroth moment of substantially zero, at one or both ends of the original encoding gradient waveform;
  - generate during an interval adjacent to each of the series of RF refocusing pulses a first gradient pulse, wherein at least one of the first gradient pulses is generated according to the modified gradient waveform, the first gradient pulses encode the NMR spin-echo signals, a Maxwell integral is substantially zero at a spin-echo time associated with the modified encoding gradient waveform, and a magnitude of the Maxwell integral is substantially equal at each of a beginning and an end of the modified encoding gradient waveform; and
  - construct an image from generated digitized samples of the NMR spin-echo signals obtained based on the encoding.

12. The MRI system of claim 11, wherein the first gradient pulses encode the NMR spin-echo signals corresponding to a first gradient axis.

13. The MRI system of claim 12, wherein the one or more processors are further configured to execute the stored programmed instructions to generate during the interval adjacent to each of the series of RF refocusing pulses a second gradient pulse, wherein at least one of the second gradient pulses is generated according to the modified encoding gradient waveform and the second gradient pulses encode the NMR spin-echo signals corresponding to a second gradient axis different from the first gradient axis.

14. The MRI system of claim 13, wherein the at least one zero zeroth-moment waveform segments comprise two bipolar pairs and the one or more processors are further configured to execute the stored programmed instructions to reverse the polarity of one of the two bipolar pairs for one of the first or second gradient axes.

15. The MRI system of claim 11, wherein the non-rectilinear encoding trajectory comprises interleaved spiral or spiral rings or a spiral trajectory comprising a spiral-out, a spiral-in, or a spiral-in-out trajectory.

16. The MRI system of claim 11, wherein the at least a portion of the original encoding gradient waveform comprises a trapezoidal gradient segment that is not concurrent with data sampling, the trapezoidal gradient segment is at one of the ends of the original encoding gradient waveform, and the one or more processors are further configured to execute the stored programmed instructions to increase or decrease the length of the trapezoidal gradient segment, while concurrently decreasing or increasing its amplitude, respectively, to increase or decrease a Maxwell integral of the original encoding gradient waveform and maintain a zero zeroth-moment of the original encoding gradient waveform.

* * * * *